(12) United States Patent
Gramegna et al.

(10) Patent No.: US 6,271,695 B1
(45) Date of Patent: Aug. 7, 2001

(54) PRECISION LOW-NOISE CURRENT MODE BIASING SCHEME FOR BJT WITH INDUCTIVE EMITTER DEGENERATION

(75) Inventors: Giuseppe Gramegna, Catania; Antonio Magazzu', Messina, both of (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 09/561,101

(22) Filed: Apr. 28, 2000

(30) Foreign Application Priority Data

Apr. 28, 1999 (IT) ............................. VA99A0010

(51) Int. Cl.[7] ............................................ H03B 1/00
(52) U.S. Cl. ......................... 327/110; 330/261; 330/283
(58) Field of Search ................................. 327/110, 563; 330/261, 283

(56) References Cited

U.S. PATENT DOCUMENTS

| | | | |
|---|---|---|---|
| 4,731,588 | * 3/1988 | Addis et al. | 330/254 |
| 5,757,215 | * 5/1998 | Schuelke et al. | 327/110 |
| 5,880,626 | * 3/1999 | Dean | 327/110 |

* cited by examiner

*Primary Examiner*—Jung Kim
(74) *Attorney, Agent, or Firm*—Theodore E. Galanthay; Allen, Dyer, Doppelt, Milbrath & Gilchrist, P.A.

(57) ABSTRACT

A low noise adaptive bias circuit is provided for a low noise bipolar junction input transistor having an emitter degeneration inductance, of an integrated high frequency functional circuit driven by the collector current of the input transistor. The bias circuit includes a shunt line connecting the base node of the input transistor to a first supply node of opposite sign of that of a second supply node to which is coupled, through the degeneration inductance, to the emitter of the input transistor. The shunt line includes a bias current generator dependent, in an inversely proportional manner, on the current gain of the input transistor, and a resistance dependent, in a directly proportional manner, on the current gain of the input transistor.

22 Claims, 5 Drawing Sheets

PRECISION LOW-NOISE CURRENT MODE BIASING SCHEME FOR BJT WITH INDUCTIVE EMITTER DEGENERATION

FIELD OF THE INVENTION

The present invention relates in general to integrated circuits, and, more particularly, to low noise circuits driven in a current mode by a low noise bipolar junction transistor with inductive emitter degeneration via the use of an integrated inductance. The invention is particularly useful in applications that encompass low noise amplifiers (LNA), mixers, charge pumps and similar high frequency devices.

BACKGROUND OF THE INVENTION

Integration of inductors on a chip within a BiCMOS process makes possible the realization of transceivers on a single chip. Single-ended or differential cascode architectures with an inductive load and inductive degeneration have been successfully integrated to produce LNAs and mixers. Typical schemes of these functional circuits relative to the production of an LNA are shown in FIGS. 1a and 1b whereas the schemes of FIGS. 2a and 2b relate to the mixer. For both applications, the figures show a single-ended architecture and a differential architecture.

Inductive degeneration of a low noise input transistor or pair of input transistors (Q1, Q3, Q4), which are commonly NPN bipolar junction transistors because of the low noise requisite, offers considerable advantages compared to a traditional resistive degeneration (in integrated circuits). Inductive degeneration introduces less noise, enhances linearity, while the inductive load, formed by a functional circuit driven in a current mode by the input transistor or pair of transistors, that in all the figures is represented by a generic oscillating circuit, permits a voltage swing on the output node that may exceed the value of the supply voltage (Vdd) of the circuit.

A broad range of dynamic excursion of the signals, an improved linearity and a good low noise performance may be usually obtained at the expense of comparably increased current absorption levels. To ensure an adequate control of the noise profile, gain and input impedance, the circuit should have a bias circuit with characteristics of high precision and low noise.

Substantially, the problem of biasing an amplifier or a mixer or any other low noise functional cascode circuit with a single or differential termination requires, in practice, biasing the transistor or each of the two transistors that make up the pair of bipolar input transistors, at the augmented level. A solution of the problem is not straightforward because of a number of effects that must be taken into account, namely: the influence on the current across the input transistor due to the spread of the parasitic resistance associated to the integrated inductor Le of degeneration; the noise contribution of the bias circuit; the dependence of the performances of the functional circuit, i.e. voltage gain, input impedance and noise profile, from the collector's bias current in the input transistor or input transistors; the fact that the collector of the input transistor (or of a second transistor in case of a cascode configuration) is at the supply voltage and thereby a feedback control of the collector's current cannot be used because introduction of a current sensor is not possible.

If the input transistor is driven in a voltage mode, the spread of the emitter's potential of the transistor will considerably and unpredictably reduce the bias current due to the exponential relationship between Vb and the collector's current Ic. Unfortunately, there is not an easy way to determine with precision the variation of the parasitic resistance Re of the integrated inductor Le of degeneration, unless a replica of the inductor is included in the biasing circuit. However, this would cause an increment of power consumption and require additional area of integration.

Moreover, the bias circuit should not significantly contribute to noise generation and increase the noise profile of the functional circuit, nor modify the input impedance. Therefore, the only way is to deliver the base bias current Ib through a DC path, for example an integrated biasing resistor Rb that notably has a typical thermal noise current of about 4 kT/Rb. This noise contribution adds directly to the input current noise of the functional circuit and should be compared to 2q*Ib, which represents the shot noise current density associated to the current Ib. Hence:

$$Inoise = 2q*Ib + 4\ kT/Rb = 2q*Ib(1+50\ mv/Rb*Ib)$$

Rb should be thoroughly sized because the bias circuit should be in a condition to supply a higher base current $Ib_{high}$ under low gain conditions of current (where $Ib_{high} = 3*Ib_{low}$). This means that the use of a correctly dimensioned physically integrated resistor Rb should establish:

$$Rb*Ib_{high} = \Delta V$$

and therefore:

$$Rb*Iblow = \Delta V/3$$

In traditional circuits with resistive degeneration it is common to alleviate these problems with a feedback control by introducing a sensor, such as for example a resistance, between the collector and the supply node or between the emitter and the ground node (or vice versa in the case of a circuit with inverted polarities). The feedback loop senses the value of the collector current Ic or of the emitter current Le and regulates the base potential Vbe (or the base bias current Ib) accordingly. This approach cannot be used in the above-considered situation because the collector of the input transistor Q1 is at the supply voltage while the emitter operates at an unknown potential.

Another known approach is to use a current mirror which may be suitable when the potential of the emitter is well defined (and reproducible) and therefore there is no need to isolate the biasing circuit from the functional circuit. Even this approach is inapplicable to the above-considered case.

An improved scheme is illustrated in FIG. 3. According to this scheme, the ratio DVc/Ic due to the variation of the emitter's potential is reduced, decoupling simultaneously the functional circuit from the biasing circuit with the resistance Rb. Although this scheme is better than the more traditional scheme based on the use of a current mirror, it still does not fully meet the above-mentioned requirements because: the collector current depends on the value of Re; the permitted voltage drop on Rb is Vdt−Vds−Vbe≅Vdd−Vth−Vbe, therefore noise contribution is not effectively minimized.

SUMMARY OF THE INVENTION

The problems and drawbacks of the above discussed known biasing circuits are overcome by the adaptive biasing circuit of the present invention, for a low noise bipolar junction input transistor with inductive emitter degeneration. The biasing circuit of the invention has the ability of automatically self-adjusting, and adapting the value of the bias resistance to the operating conditions to fully exploit the tolerable range of voltage drop. The value of the bias resistance decreases under low current gain conditions and increases under high current gain conditions, thus reducing the noise current contribution, and safeguarding and preserving the noise performance of the functional circuit.

According to another aspect of the invention the circuit implements a current mode driving scheme for each input transistor in order to eliminate the exponential relationship between the collector's current that drives the functional circuit and the base-emitter voltage Vbe of the input transistor. Substantially, according to the invention, the biasing circuit may be represented as a shunt line connecting the base node of the input transistor to a supply rail of opposite sign of the supply rail to which the emitter of the input transistor, through the inductance of degeneration, is coupled. This shunt line is composed of a generator of a bias current whose value depends on the current gain of the input transistor and of a resistance whose value depends on the current gain of the input transistor.

This bias adaptability to the operating conditions of the input transistor (i.e. to its current gain) is realized by the use of a transistor of type and geometry identical to those of the input transistor, which may eventually and preferably be scaled down in size to reduce the area of integration and the consumption. A current is forced through the transistor by a dedicated generator of the collector's current to reproduce a current density condition in this replica transistor corresponding to a pre-established current density for a correct operating condition of the input transistor. Therefore, the bias current injected on the base node of the transistor depends on the base-collector voltage sensed on such a replica transistor. In this way it is possible to ensure with excellent accuracy a correct current density in the input transistor by modulating the bias current that is injected on its base node.

BRIEF DESCRIPTION OF THE DRAWINGS

The various aspects and advantages of the invention will become even more evident through the following description of several embodiments and by referring to the attached drawings.

DETAILED DESCRIPTION OF THE PREFERRED EMBODIMENTS

Figure 1B:
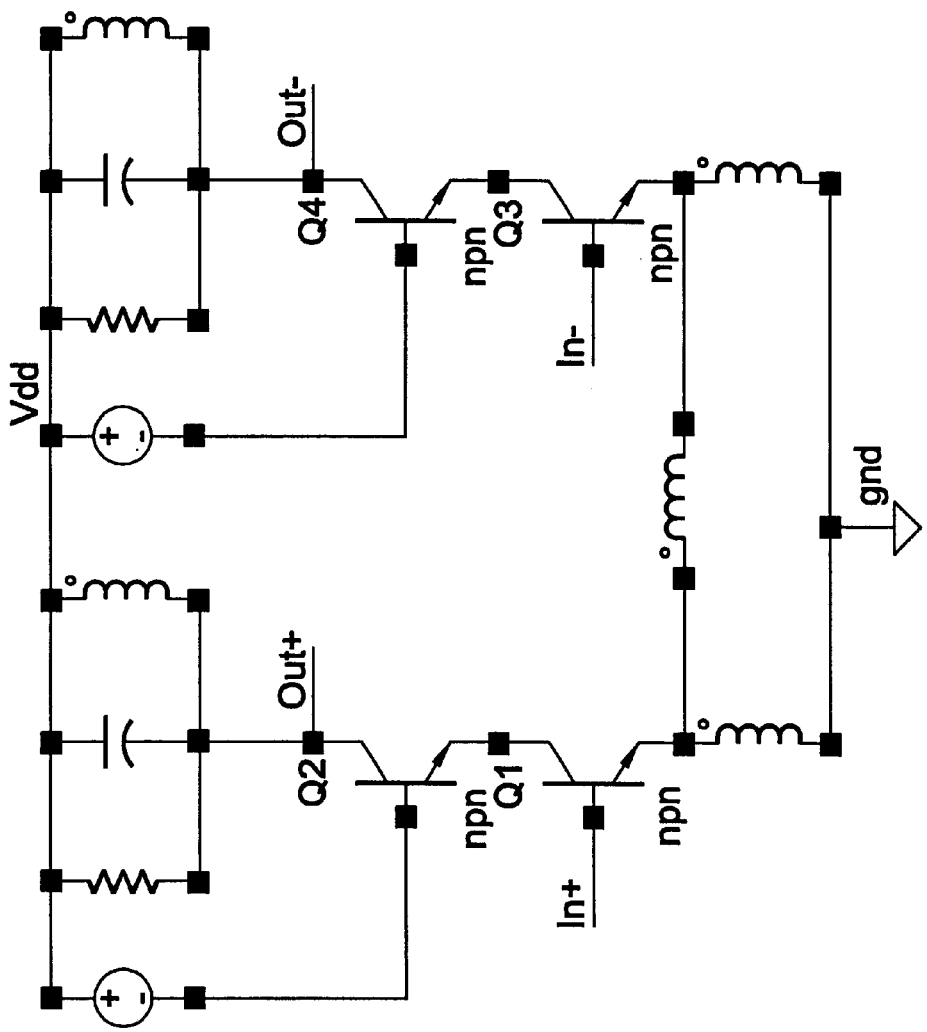
FIGS. 1a and 1b are basic schemes of a cascode stage driven in current mode, representing a generic low noise amplifier (LNA), with a single-ended and differential architecture, respectively.
Figure 1A:
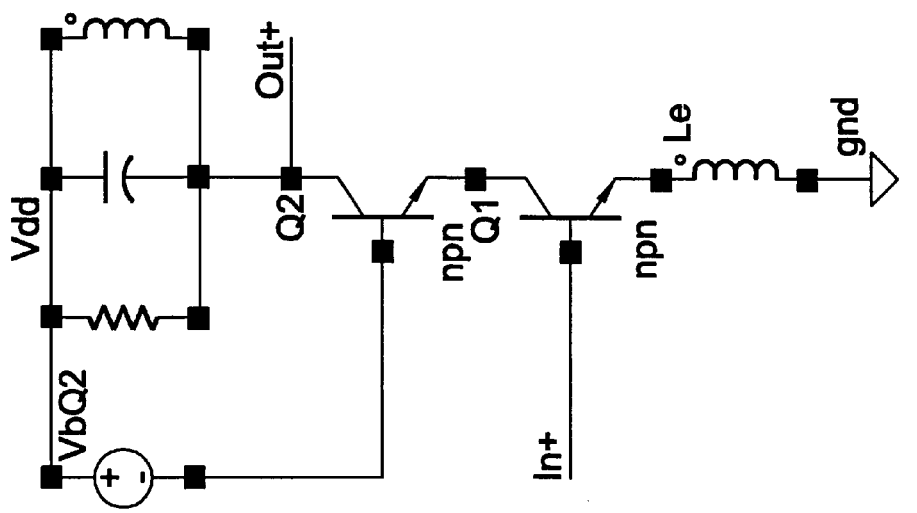
Figure 2B:
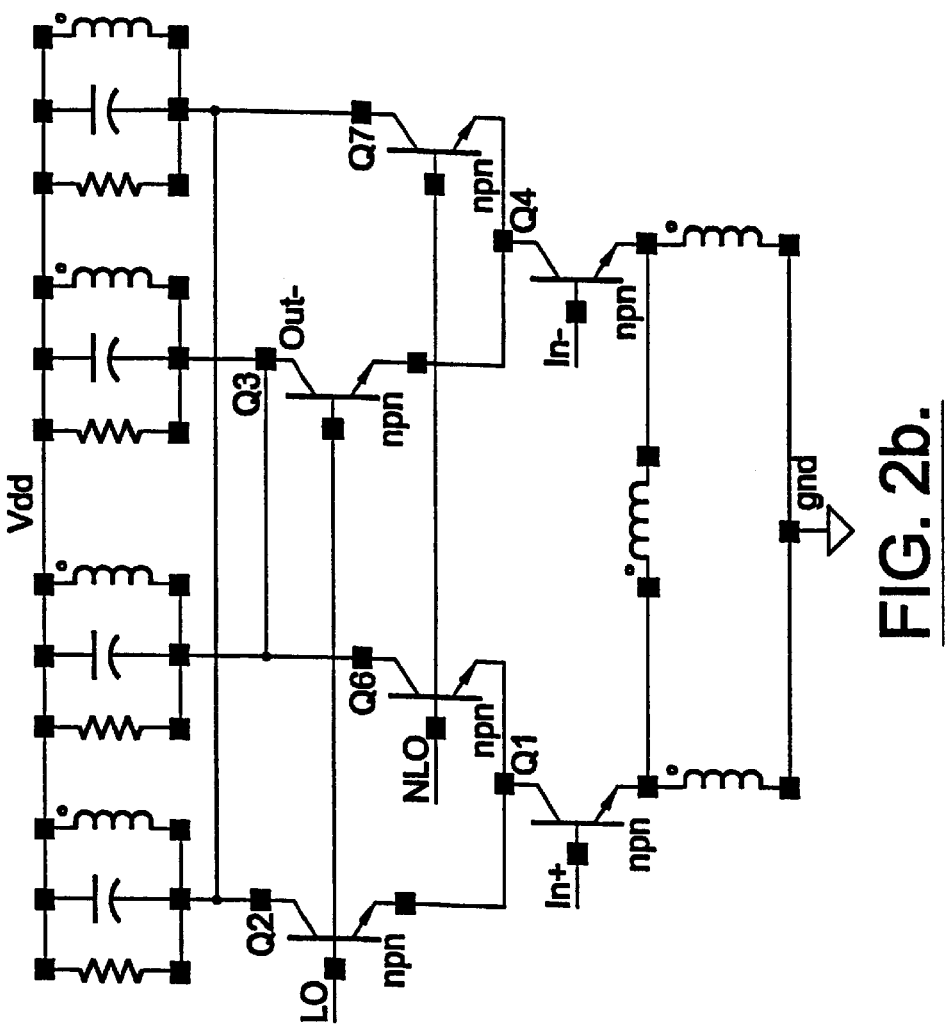
FIGS. 2a and 2b are basic schemes of a cascode stage driven in current mode, representing a mixer, with a single-ended and differential architecture, respectively.
Figure 2A:
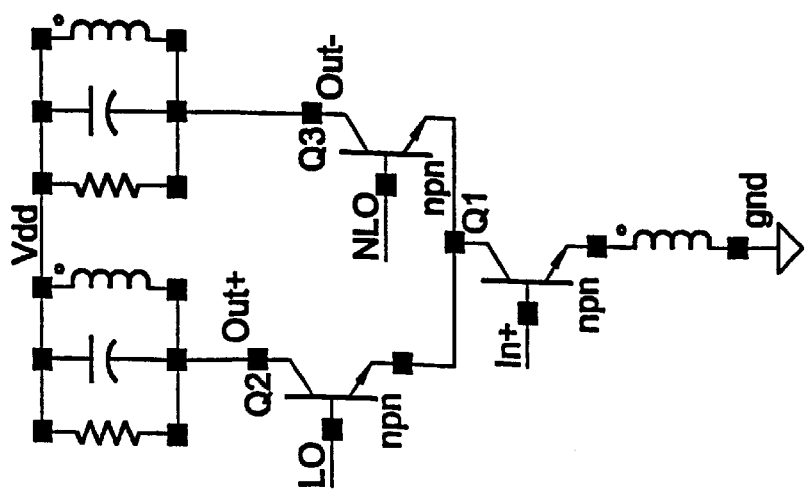
Figure 3:
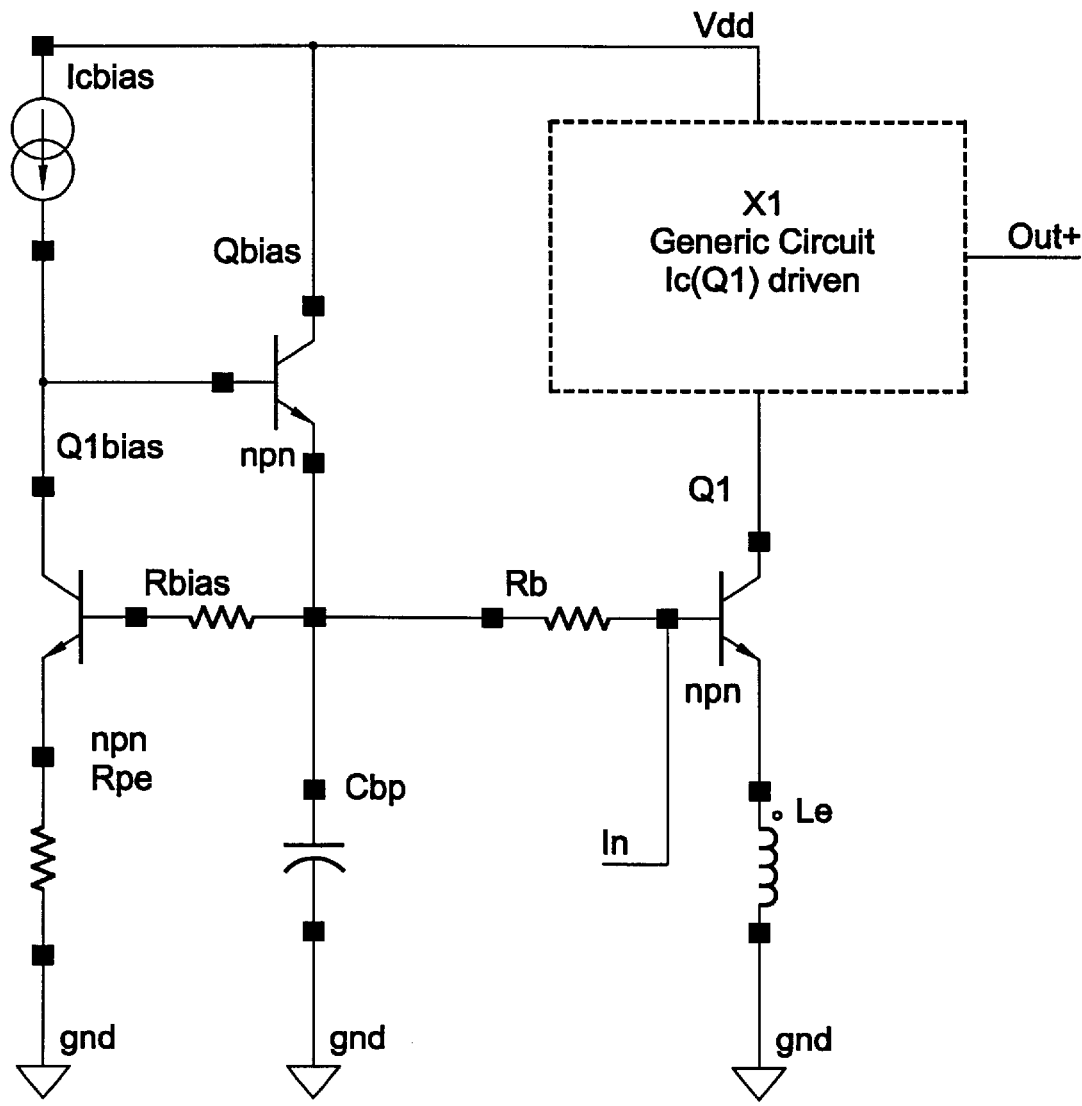
FIG. 3 is a bias scheme of an input transistor according to a known technique.
Figure 4:
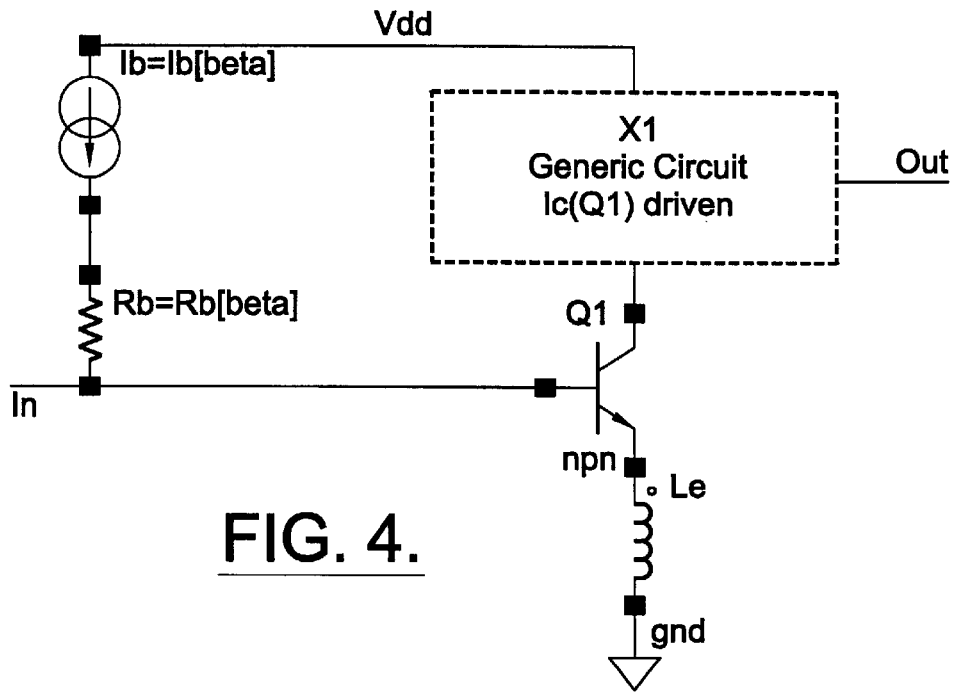
FIG. 4 is a basic bias scheme of an input transistor, according to the present invention.

With reference to FIG. 4, the adaptive bias circuit of the invention includes a shunt line connecting the base node of an input transistor Q1 to a first supply node Vdd of opposite sign of the second supply node GND, to which the emitter of the input transistor Q1, through an inductance Le of emitter degeneration is coupled. Substantially, the shunt line includes a generator of a bias current Ib with a value which is inversely proportional to the current gain b (and directly proportional to the collector's current Ic) of the input transistor Q1 and of a resistance Rb whose value is directly proportional to the current gain b of the input transistor Q1.

In this description and in the following, the functional circuit driven in current mode by the input transistor Q1, will be generally indicated by a block X1. Of course, the scheme of the input transistor Q1 and of the respective circuit block X1 and of the integrated inductor Le of emitter degeneration may represent either a single-ended architecture or one branch of a differential architecture. In differential applications, the bias circuit of the invention is duplicated for both input transistors. Therefore, for simplifying the ensuing description, reference will be made to a single input transistor (Q1) and it should be clear that the same considerations will be also perfectly applicable to an eventual second input transistor in case of a differential architecture.

Figure 5:
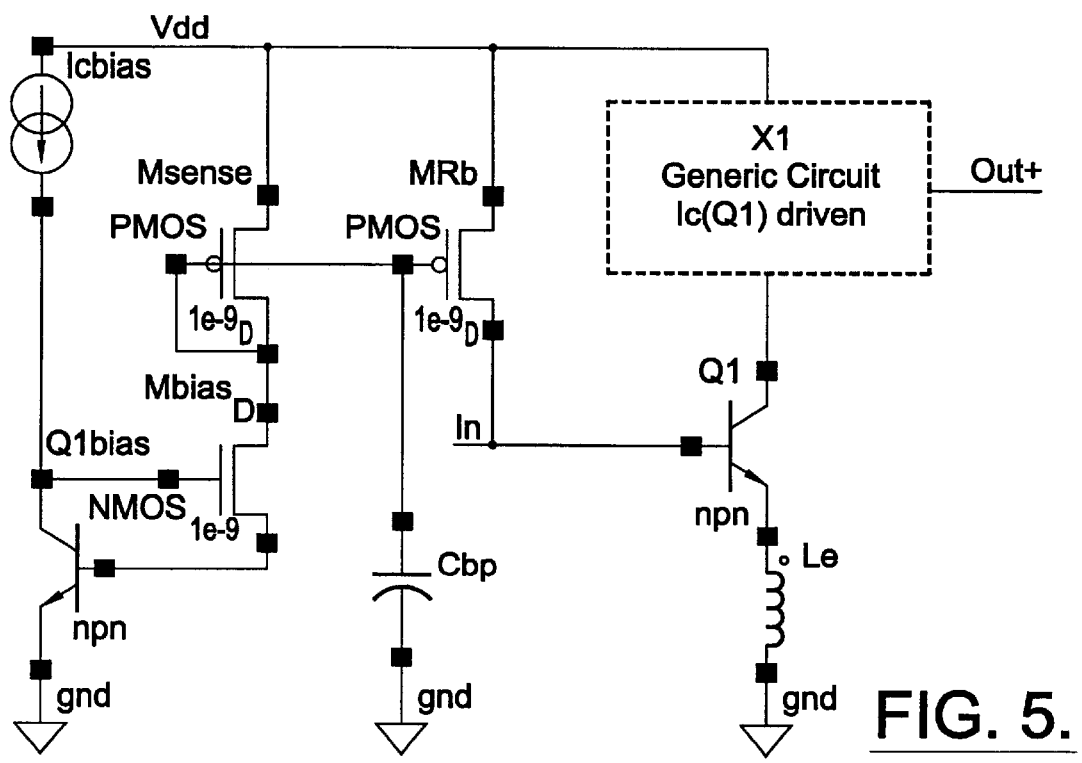
FIGS. 5 and 6 are circuit diagrams relative to a first embodiment of the circuit of the invention that can be realized with BiCMOS technology or a bipolar process.

The scheme of FIG. 5 shows a first embodiment of the invention realized with a BiCMOS technology. The generator Ib and the resistance Rb, both dependent on the current gain b of the input transistor Q1, are implemented by the MOS transistor MRb that injects on the base node of the input transistor Q1 a bias current equivalent to the ratio between the collector and the current gain. The series resistance of the transistor MRb, i.e. $Rds_{(MRb)}$ is proportional to the current gain b of the input bipolar transistor (or more precisely of the homologous bipolar transistor Q1bias) to keep the voltage drop across the transistor MRb equal to DV=Vdd−Vbe−Ve. This is the proper electrical behavior of a MOS transistor wherein the series resistance decreases upon increasing the current density.

The bias circuit of the invention functions as follows. A DC $Ic_{bias}$ is forced from the generator on the Q1bias transistor, which is a scaled down replica of the input transistor Q1. The value of this current is such to reproduce on the Q1bias transistor the same current density that is desired in the input transistor Q1 to be biased. The base current of the replica transistor Q1bias is provided by a MOS transistor Mbias in function of the base-collector voltage of the replica transistor Q1bias. The base current dependent on the base-collector voltage of the replica transistor Q1bias, homologous to the input transistor Q1, drives the current mirror formed by the pair of MOS transistors Msense and MRB. In this embodiment, the MRb transistor functions as a generator of the bias current Ib as well as a variable resistance Rb of the basic scheme of FIG. 4.

The adaptive reduction of the value of Rb is ensured by the decrease of the drain-source resistance (Rds) of a MOS transistor when the current is increased. Therefore, the functional circuit X1 is biased by the collector's current of the input transistor Q1. This current Ic is equal to $k*Ic_{bias}$, where k is the area ratio between the input transistor Q1 and the replica transistor Q1bias. Hence, the value of the current Ic is insensitive to the variations of the parasitic resistance Re associated to the integrated inductor Le of emitter degeneration of the input bipolar transistor Q1.

In addition, the functional circuit X1 retains unchanged its noise profile allowed by the established current gain. Between the control node of the current mirror formed by the pair of MOS transistors Msense and MRb and ground, there is a capacitor Cbp that serves to minimize the noise contribution originated by the bias circuit.

The above considerations regarding the level of contribution of the thermal noise of an integrated bias resistor remain valid by substituting the thermal noise 4 kT/Rb with the thermal noise generated by an MOS transistor equal to $\frac{2}{3}$*kT*gm. Other sources of noise that may be associated with the MRb transistor such as for example flicker noise and gate induced noise, have a negligible contribution to the noise profile of the functional circuit X1 because of the high value of the series resistance $Rds_{MRb}$ of the MOS transistor and of the by-pass capacitor Cbp.

Figure 6:
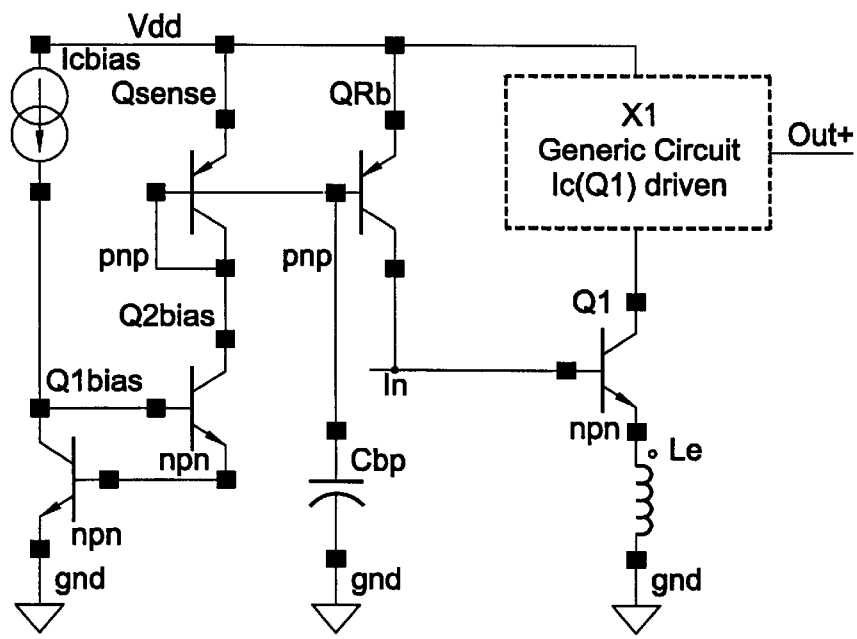

Of course, the bias circuit of the invention may be realized entirely with a bipolar technology, as shown in FIG. 6, with the necessary changes. The same considerations made in connection with the scheme of the BiCMOS embodiment of FIG. 5 remain valid. Moreover, the noise contribution due the MRb transistor decreases with the transconductance of the transistor considering the level of the imposed current Ib. Furthermore, the RF isolation between the functional circuit X1 and the bias circuit of the bipolar transistor Q1 is enhanced by reducing the dimensions of the Mrb transistor.

The length and width of the channel of the MRb transistor should be maintained at minimum values, compatibly with the level of the base current to be delivered. On the other hand, such a minimization of size reduces the precision of the current mirror MRb-Msense and therefore a compromise must be sought. This limit to optimization is overcome by the alternative and preferred embodiment illustrated in FIG. 7.

Figure 7:
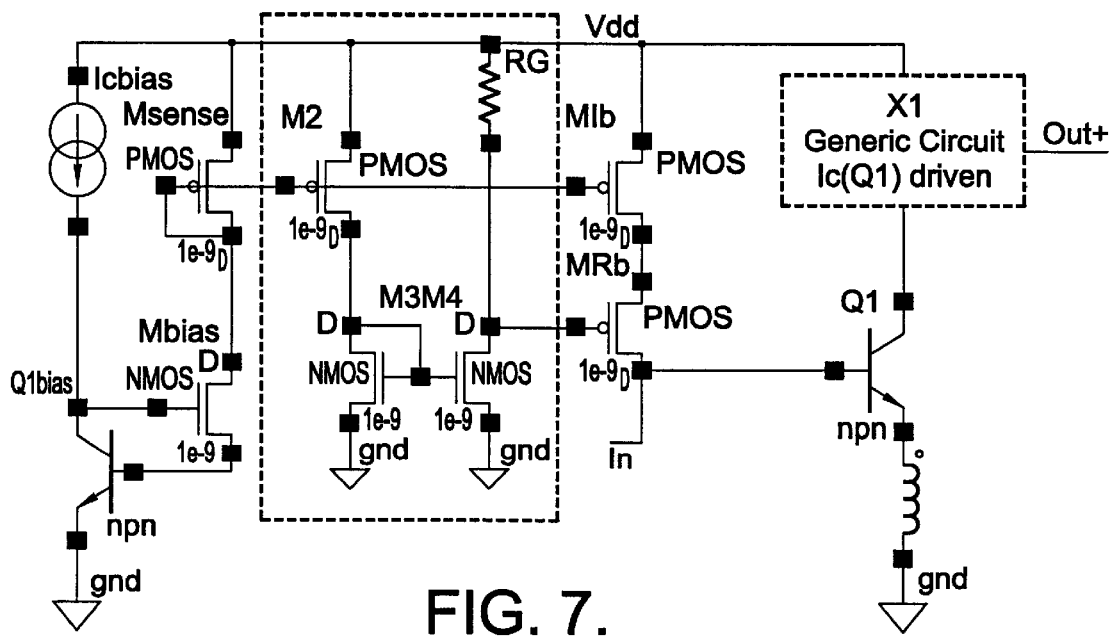
FIG. 7 is the circuit diagram relative to another embodiment of the circuit of the invention.

According to the alternative BiCMOS embodiment shown in FIG. 7, the MOS MRb transistor acts as a Rb*b resistance of the basic scheme of FIG. 4, while a second transistor MOS MIb acts as a generator of the bias current Ib which depends on the current gain b and more precisely is given by Ib=Ic/b. In practice, according to this alternative embodiment, the functions of adaptively controlled current generator (Ib) and resistance (Rb) are split and are performed by two different devices, using a second current mirror complementary to the first current mirror.

In FIG. 7, the additional elements that differentiate this alternative embodiment from the embodiment of FIG. 5 are identified by enclosing them in a dash line perimeter. The complementary current mirror formed by the pair of MOS transistors M3 and M4 is driven by the transistor M2 forming a current mirror with the Msense transistor. According to this embodiment, the precision of current mirroring between Msense and M1b, forming the current generator Ib of the basic scheme of FIG. 4 is preserved at a high level by exploiting the added current mirror, formed by M2, M3, M4 and by the load resistance RG, in order to adaptively reduce the value of Rb that corresponds to the drain-source resistance of the MRb transistor at high levels of delivered base current (i.e. for conditions of low current gain of the input transistor) without compromising the mirroring precision of the current from Msense to M1b.

Of course, the reduction of Rb reduces the range of variation of the voltage drop on the transistor MRB. The value of Ib (i.e. of the value of the current gain of the replica transistor Q1bias and then substantially equivalent to that of the input transistor Q1) is sensed and as a consequence the value of the gate voltage of the transistor MRb is adjusted. The M4 transistor saturates with medium or high values of current gain. When the current gain is low, M4 exits saturation and its gate potential is forced to approximate the ground potential GND, thus reducing the value of the drain-source resistance of the transistor MRB.

A further advantage of the embodiment of FIG. 7 is due to the fact that the Early effect of the current mirror formed by Msense and Mrb is compensated and thereby the precision of the mirror is enhanced. In practice, while in the embodiment of FIG. 5 the entire range of the voltage drop on Rb may be used, in the embodiment of FIG. 7 such a range is restricted, but although the mirroring precision and the isolation between the bias circuit and the functional circuit X1 are remarkably enhanced.

In case of cascode architectures, the precision of the bias circuit of the invention is further enhanced because the Early effect of the input transistor may be rendered negligible by ensuring that the collector's potential of the input transistor and that of the replica transistor be identical. Of course the circuit of FIG. 7 may be totally realized with a bipolar technology.

That which is claimed:

1. A low-noise adaptive bias circuit for a low-noise bipolar junction-input transistor having an emitter collector current for driving an integrated high frequency functional circuit, the bias circuit comprising:

a first voltage supply node;

a second voltage supply node of an opposite sign as the first voltage supply node, and for connection to the emitter of the input transistor via the emitter degeneration inductance; and a shunt for connecting the base of the input transistor to the first voltage supply node, and for generating a bias current which is dependent, in an inversely proportional manner, on a current gain of the input transistor, via a resistance which is dependent, in a directly proportional manner, on the current gain of the input transistor.

2. A bias circuit according to claim 1, wherein the shunt comprises:

a current mirror including
a current generator connected to the first voltage supply node,
an output transistor,
an input device connected to the output transistor,
a third transistor for providing a bias current to the input device, and
a fourth transistor for providing a base-collector voltage to the third transistor, the fourth transistor being a substantially identical type as the input transistor and having a collector connected to the current generator, and an emitter connected to the second voltage supply node.

3. A bias circuit according to claim 2, wherein the current mirror further comprises:

a control node between the output transistor and the input device; and a capacitor connected between the control node and the second voltage supply node.

4. A bias circuit according to claim 2, wherein the output transistor, the input device and the third transistor are MOSFET transistors.

5. A bias circuit according to claim 2, wherein the input transistor and the fourth transistor are low noise integrated NPN transistors, the output transistor and the input device are PMOS transistors, and the third transistor is an NMOS transistor.

6. A bias circuit according to claim 2, wherein each of the transistors is a bipolar junction transistor.

7. A bias circuit according to claim 2, further comprising a second current mirror complementary to the current mirror, wherein the resistance is defined by a series resistance of the output transistor which is controlled by the second current mirror, and wherein the first current mirror comprises a fifth transistor providing the bias current on the base of the input transistor.

8. A drive circuit for driving an integrated high frequency functional circuit, the drive circuit comprising:
 a bipolar junction input transistor having a degeneration inductance, and for generating a collector current to drive the integrated high frequency functional circuit; and
 an adaptive bias circuit for the input transistor, and comprising
  a first voltage supply node,
  a second voltage supply node connected to the emitter of the input transistor, and
  a shunt connecting the base of the input transistor to the first voltage supply node, and for generating a bias current which is inversely proportionally dependent on a current gain of the input transistor, via a resistance which is proportionally dependent on the current gain of the input transistor.

9. A drive circuit according to claim 8, wherein the shunt comprises:
 a current mirror including
  a current generator connected to the first voltage supply node,
  an output transistor,
  an input device connected to the output transistor,
  a third transistor providing a bias current to the input device, and
  a fourth transistor providing a base-collector voltage to the third transistor, the fourth transistor being a substantially identical type as the input transistor, having a collector connected to the current generator, and an emitter connected to the second voltage supply node.

10. A drive circuit according to claim 9, wherein the current mirror further comprises:
 a control node between the output transistor and the input device; and
 a capacitor connected between the control node and the second voltage supply node.

11. A drive circuit according to claim 9, wherein the output transistor, the input device and the third transistor are MOSFET transistors.

12. A drive circuit according to claim 9, wherein the input transistor and the fourth transistor are low noise integrated NPN transistors, the output transistor and the input device are PMOS transistors, and the third transistor is an NMOS transistor.

13. A drive circuit according to claim 9, wherein each of the transistors is a bipolar junction transistor.

14. A drive circuit according to claim 9, further comprising a second current mirror complementary to the current mirror, wherein the resistance is defined by a series resistance of the output transistor which is controlled by the second current mirror, and wherein the first current mirror comprises a fifth transistor providing the bias current to the input transistor.

15. A method of biasing a bipolar junction input transistor having a degeneration inductance, the method comprising:
 connecting a first voltage supply to the base of the input transistor; and
 biasing the base of the input transistor by generating a bias current which is inversely proportionally dependent on a current gain of the input transistor, passing the bias current through a resistance which is proportionally dependent from the current gain of the input transistor, and connecting a second voltage supply to the emitter of the input transistor.

16. A method according to claim 15, wherein the input transistor generates a collector current for driving an integrated high frequency functional circuit.

17. A method according to claim 15, wherein the biasing comprises:
 providing a current mirror including
  a current generator connected to the first voltage supply,
  an output transistor,
  an input device connected to the output transistor,
  a third transistor providing a second bias current to the input device, and
  a fourth transistor providing a base-collector voltage to the third transistor, the fourth transistor being a substantially identical type as the input transistor, having a collector connected to the current generator, and an emitter connected to the second voltage supply.

18. A method according to claim 15, wherein the current mirror further comprises:
 a control node between the output transistor and the input device; and
 a capacitor connected between the control node and the second voltage supply.

19. A method according to claim 15, wherein the output transistor, the input device and the third transistor are MOSFET transistors.

20. A method according to claim 15, wherein the input transistor and the fourth transistor are low noise integrated NPN transistors, the output transistor and the input device are PMOS transistors, and the third transistor is an NMOS transistor.

21. A method according to claim 15, wherein each of the transistors is a bipolar junction transistor.

22. A method according to claim 15, further comprising providing a second current mirror complementary to the current mirror, wherein the resistance is defined by a series resistance of the output transistor which is controlled by the second current mirror, and wherein the first current mirror comprises a fifth transistor providing the bias current to the input transistor.

* * * * *